United States Patent
Srirattana et al.

(10) Patent No.: US 10,742,189 B2
(45) Date of Patent: Aug. 11, 2020

(54) SWITCHED MULTI-COUPLER APPARATUS AND MODULES AND DEVICES USING SAME

(71) Applicant: SKYWORKS SOLUTIONS, INC., Woburn, MA (US)

(72) Inventors: Nuttapong Srirattana, Billerica, MA (US); Zhiyang Liu, Dunstable, MA (US); David Ryan Story, Ladera Ranch, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 15/997,864

(22) Filed: Jun. 5, 2018

(65) Prior Publication Data
US 2018/0351530 A1 Dec. 6, 2018

Related U.S. Application Data

(60) Provisional application No. 62/515,576, filed on Jun. 6, 2017.

(51) Int. Cl.
| | |
|---|---|
| *H01P 5/18* | (2006.01) |
| *H03H 7/46* | (2006.01) |
| *H03H 7/48* | (2006.01) |
| *H01F 38/14* | (2006.01) |
| *H03G 3/30* | (2006.01) |

(52) U.S. Cl.
CPC .............. *H03H 7/468* (2013.01); *H01F 38/14* (2013.01); *H01P 5/184* (2013.01); *H03G 3/3042* (2013.01); *H03H 7/48* (2013.01)

(58) Field of Classification Search
CPC ................ H01P 5/12; H01P 5/18; H03H 7/46
See application file for complete search history.

(56) References Cited

U.S. PATENT DOCUMENTS

| | | |
|---|---|---|
| 3,611,199 A | 10/1971 | Safran |
| 3,868,594 A | 2/1975 | Cornwell et al. |
| 4,460,875 A | 7/1984 | Harman |
| 4,677,399 A | 6/1987 | Le Dain et al. |
| 4,764,740 A | 8/1988 | Meyer |
| 5,038,112 A | 8/1991 | O'Neill |
| 5,222,246 A | 6/1993 | Wolkstein |
| 5,276,411 A | 1/1994 | Woodin, Jr. et al. |
| 5,363,071 A | 11/1994 | Schwent et al. |

(Continued)

FOREIGN PATENT DOCUMENTS

| | | |
|---|---|---|
| EP | 2503701 A2 | 9/2012 |
| JP | S62-159502 A | 7/1987 |

(Continued)

OTHER PUBLICATIONS

Chen et al., "A High-Directivity Microsliip Directional Coupler With Feedback Compensation", 2002 IEEE MTT-S International Microwave Symposium Digest, issued in 2002, pp. 101-104.

*Primary Examiner* — Dean O Takaoka
(74) *Attorney, Agent, or Firm* — Lando & Anastasi, LLP

(57) ABSTRACT

An electromagnetic coupler apparatus includes a plurality of couplers, each having a coupled port and an isolation port. The coupler apparatus includes an output port configured to provide a coupled signal from one or more of the plurality of couplers, and a number of selection control inputs. Each of the selection control inputs is configured to control one or more switches to select an individual one of the plurality of couplers to provide at least a portion of the coupled signal at the output port.

23 Claims, 9 Drawing Sheets

(56) References Cited

U.S. PATENT DOCUMENTS

| | | |
|---|---|---|
| 5,487,184 A | 1/1996 | Nagode |
| 5,625,328 A | 4/1997 | Coleman, Jr. |
| 5,745,016 A | 4/1998 | Salminen |
| 5,767,753 A | 6/1998 | Ruelke |
| 5,903,820 A | 5/1999 | Hagstrom |
| 6,020,795 A | 2/2000 | Kim |
| 6,078,299 A | 6/2000 | Scharfe, Jr. |
| 6,108,527 A | 8/2000 | Urban et al. |
| 6,329,880 B2 | 12/2001 | Akiya |
| 6,496,708 B1 | 12/2002 | Chan et al. |
| 6,559,740 B1 | 5/2003 | Schulz et al. |
| 6,771,141 B2 | 8/2004 | Iida et al. |
| 6,803,818 B2 | 10/2004 | van Amerom |
| 6,972,640 B2 | 12/2005 | Nagamori et al. |
| 7,042,309 B2 | 5/2006 | Podell |
| 7,224,244 B2 | 5/2007 | Drapac et al. |
| 7,230,316 B2 | 6/2007 | Yamazaki et al. |
| 7,236,069 B2 | 6/2007 | Puoskari |
| 7,305,223 B2 | 12/2007 | Liu et al. |
| 7,319,370 B2 | 1/2008 | Napijalo |
| 7,336,142 B2 | 2/2008 | Vogel |
| 7,493,093 B2 | 2/2009 | Boerman et al. |
| 7,538,635 B2 | 5/2009 | Fukuda et al. |
| 7,546,089 B2 | 6/2009 | Bellantoni |
| 7,966,140 B1 | 6/2011 | Gholson, III et al. |
| 7,973,358 B2 | 7/2011 | Hanke et al. |
| 8,115,234 B2 | 2/2012 | Nakajima et al. |
| 8,175,554 B2 | 5/2012 | Camuffo et al. |
| 8,248,302 B2 | 8/2012 | Tsai et al. |
| 8,289,102 B2 | 10/2012 | Yamamoto et al. |
| 8,315,576 B2 | 11/2012 | Jones |
| 8,334,580 B2 | 12/2012 | Sakurai et al. |
| 8,417,196 B2 | 4/2013 | Kitching et al. |
| 8,526,890 B1 | 9/2013 | Chien et al. |
| 8,606,198 B1 | 12/2013 | Wright |
| 8,633,761 B2 | 1/2014 | Lee |
| 8,761,026 B1 | 6/2014 | Berry et al. |
| 8,810,331 B2 | 8/2014 | Gu et al. |
| 9,014,647 B2 | 4/2015 | Kitching et al. |
| 9,214,967 B2 | 12/2015 | Reisner et al. |
| 9,225,382 B2 | 12/2015 | Khlat |
| 9,356,330 B1 | 5/2016 | Donoghue et al. |
| 9,425,835 B2 | 8/2016 | Seckin et al. |
| 9,496,902 B2 | 11/2016 | Srirattana et al. |
| 9,553,617 B2 | 1/2017 | Srirattana et al. |
| 9,634,371 B2 | 4/2017 | Swarup et al. |
| 9,647,314 B1 | 5/2017 | Nguyen et al. |
| 9,748,627 B2 | 8/2017 | Sun et al. |
| 9,755,670 B2 | 9/2017 | Chen et al. |
| 10,403,955 B2 | 9/2019 | Srirattana et al. |
| 2002/0097100 A1 | 7/2002 | Woods et al. |
| 2002/0113601 A1 | 8/2002 | Swank |
| 2002/0113666 A1 | 8/2002 | Yamazaki et al. |
| 2002/0139975 A1 | 10/2002 | Lewis et al. |
| 2003/0214365 A1 | 11/2003 | Adar et al. |
| 2004/0127178 A1 | 7/2004 | Kuffner |
| 2004/0201526 A1 | 10/2004 | Knowles et al. |
| 2005/0017821 A1 | 1/2005 | Sawicki |
| 2005/0040912 A1 | 2/2005 | Pelz |
| 2005/0146394 A1 | 7/2005 | Podell |
| 2005/0170794 A1 | 8/2005 | Koukkari et al. |
| 2005/0239421 A1 | 10/2005 | Kim et al. |
| 2006/0232359 A1 | 10/2006 | Fukuda et al. |
| 2007/0082642 A1 | 4/2007 | Hattori |
| 2007/0159268 A1 | 7/2007 | Podell |
| 2008/0036554 A1 | 2/2008 | Krausse et al. |
| 2008/0055187 A1 | 3/2008 | Tamura et al. |
| 2008/0056638 A1 | 3/2008 | Glebov et al. |
| 2008/0070519 A1 | 3/2008 | Okabe |
| 2008/0112466 A1 | 5/2008 | Sasaki |
| 2009/0134953 A1 | 5/2009 | Hunt et al. |
| 2009/0195335 A1 | 8/2009 | Wahl et al. |
| 2009/0278624 A1 | 11/2009 | Tsai et al. |
| 2009/0280755 A1 | 11/2009 | Camuffo et al. |
| 2009/0322313 A1 | 12/2009 | Zhang et al. |
| 2011/0057746 A1 | 3/2011 | Yamamoto et al. |
| 2011/0063044 A1 | 3/2011 | Jones |
| 2011/0148548 A1 | 6/2011 | Uhm et al. |
| 2011/0199166 A1 | 8/2011 | Carrillo-Ramirez |
| 2011/0254637 A1 | 10/2011 | Manssen et al. |
| 2011/0255575 A1 | 10/2011 | Zhu et al. |
| 2011/0279192 A1 | 11/2011 | Nash et al. |
| 2011/0298559 A1 | 12/2011 | Kitching et al. |
| 2012/0019332 A1 | 1/2012 | Hino et al. |
| 2012/0019335 A1 | 1/2012 | Hoang et al. |
| 2012/0062333 A1 | 3/2012 | Ezzeddine et al. |
| 2012/0071123 A1 | 3/2012 | Jones et al. |
| 2012/0195351 A1 | 8/2012 | Banwell et al. |
| 2012/0243579 A1 | 9/2012 | Premakanthan et al. |
| 2013/0005284 A1 | 1/2013 | Dalipi |
| 2013/0113575 A1 | 5/2013 | Easter |
| 2013/0194054 A1 | 8/2013 | Presti |
| 2013/0207741 A1 | 8/2013 | Presti |
| 2013/0241668 A1 | 9/2013 | Tokuda et al. |
| 2013/0293316 A1 | 11/2013 | Kitching et al. |
| 2013/0307635 A1 | 11/2013 | Kase et al. |
| 2014/0152253 A1 | 6/2014 | Ozaki et al. |
| 2014/0213201 A1 | 7/2014 | Reisner et al. |
| 2014/0227982 A1 | 8/2014 | Granger-Jones et al. |
| 2014/0266499 A1 | 9/2014 | Noe |
| 2014/0368293 A1 | 12/2014 | Mukaiyama |
| 2015/0002239 A1 | 1/2015 | Tanaka |
| 2015/0042412 A1 | 2/2015 | Imbornone et al. |
| 2015/0043669 A1 | 2/2015 | Ella et al. |
| 2015/0048910 A1 | 2/2015 | LaFountain et al. |
| 2015/0072632 A1 | 3/2015 | Pourkhaatoun et al. |
| 2015/0091668 A1 | 4/2015 | Solomko et al. |
| 2015/0200437 A1 | 7/2015 | Solomko et al. |
| 2015/0249485 A1 | 9/2015 | Ouyang et al. |
| 2015/0270821 A1 | 9/2015 | Natarajan et al. |
| 2015/0326202 A1 | 11/2015 | Nicholls et al. |
| 2015/0349742 A1 | 12/2015 | Chen et al. |
| 2015/0372366 A1 | 12/2015 | Frye |
| 2016/0025928 A1 | 1/2016 | Onawa |
| 2016/0028147 A1 | 1/2016 | Srirattana et al. |
| 2016/0028420 A1 | 1/2016 | Srirattana et al. |
| 2016/0043458 A1 | 2/2016 | Sun et al. |
| 2016/0065167 A1 | 3/2016 | Granger-Jones et al. |
| 2016/0079649 A1 | 3/2016 | Ilkov et al. |
| 2016/0079650 A1 | 3/2016 | Solomko et al. |
| 2016/0172737 A1* | 6/2016 | Srirattana ............... H01P 5/185 333/111 |
| 2016/0172738 A1 | 6/2016 | Srirattana et al. |
| 2016/0172739 A1 | 6/2016 | Srirattana et al. |
| 2016/0172740 A1 | 6/2016 | Srirattana et al. |
| 2016/0268994 A1 | 9/2016 | Granger-Jones et al. |
| 2016/0344430 A1 | 11/2016 | Srirattana et al. |
| 2016/0344431 A1 | 11/2016 | Srirattana et al. |
| 2016/0373146 A1 | 12/2016 | Manssen et al. |
| 2017/0026020 A1 | 1/2017 | Solomko et al. |
| 2017/0033428 A1 | 2/2017 | Ootsuka et al. |
| 2017/0063425 A1 | 3/2017 | Khlat et al. |
| 2017/0085245 A1 | 3/2017 | Srirattana et al. |
| 2017/0141802 A1 | 5/2017 | Solomko et al. |
| 2019/0379099 A1 | 12/2019 | Srirattana et al. |

FOREIGN PATENT DOCUMENTS

| | | |
|---|---|---|
| JP | H01274502 A | 11/1989 |
| JP | H08505750 A | 6/1996 |
| JP | 2000-077915 A | 3/2000 |
| JP | 2001127664 A | 5/2001 |
| JP | 2011040978 A | 2/2011 |
| JP | 2013126067 A | 6/2013 |
| KR | 20040037465 A | 5/2004 |
| KR | 20110118289 A | 10/2011 |
| KR | 20120007790 A | 1/2012 |
| WO | 2005018451 A1 | 3/2005 |
| WO | 2015020927 A2 | 2/2015 |
| WO | 2015134979 A1 | 9/2015 |

* cited by examiner

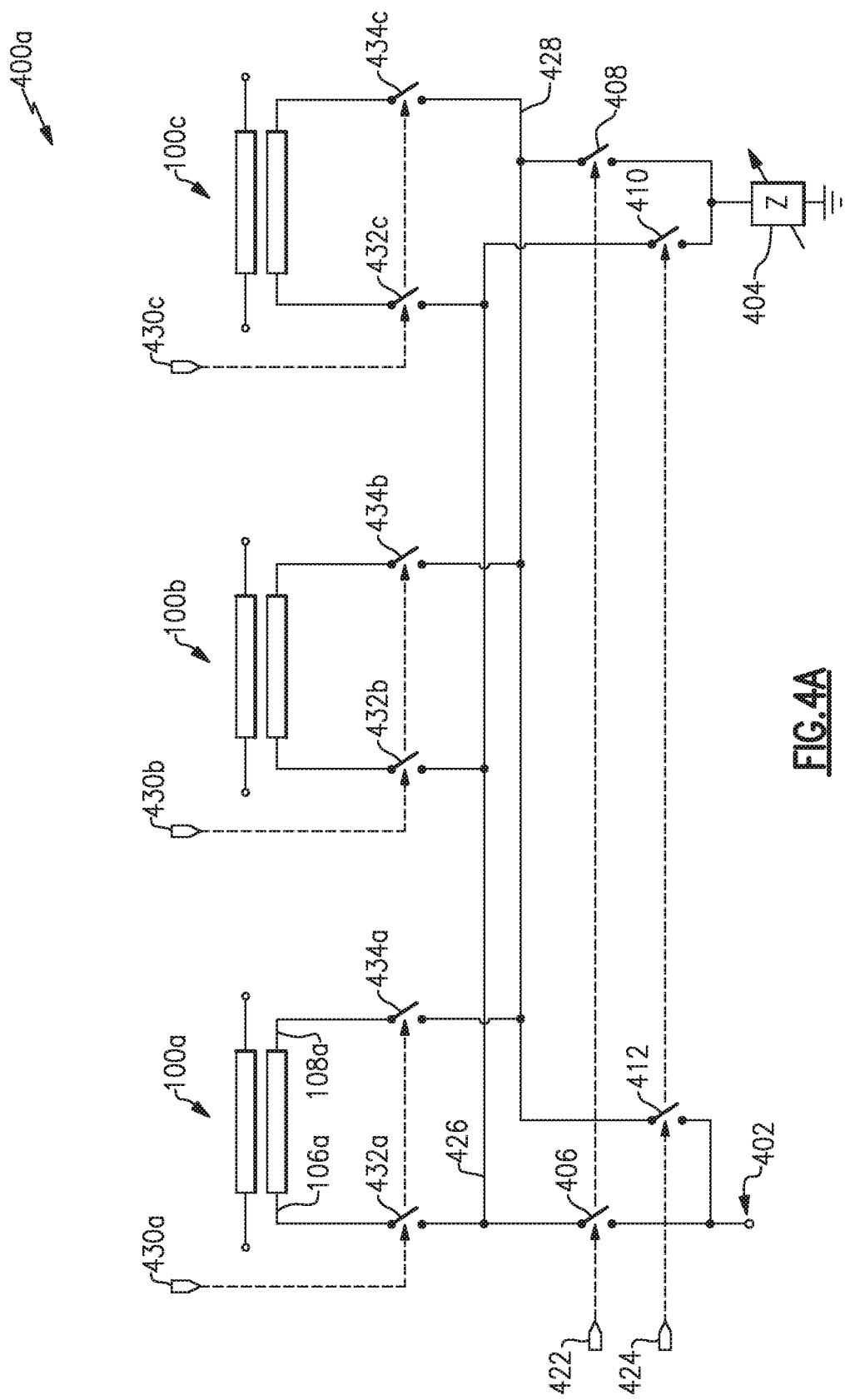

SWITCHED MULTI-COUPLER APPARATUS AND MODULES AND DEVICES USING SAME

CROSS-REFERENCE TO RELATED APPLICATIONS

This application claims the benefit under 35 U.S.C. § 119(e) of U.S. Provisional Patent Application No. 62/515,576 titled SWITCHED MULTI-COUPLER APPARATUS AND MODULES AND DEVICES USING SAME, filed on Jun. 6, 2017, which is hereby incorporated by reference in its entirety for all purposes.

BACKGROUND

Directional couplers are widely used in front end module (FEM) products, such as in radio transceivers, wireless handsets, and the like. For example, a directional coupler can be used to detect and monitor electromagnetic (EM) output power in a transmitter, or antenna reflected power, for example. When a radio frequency (RF) signal generated by an RF source is provided to a load, such as to an antenna, a portion of the RF signal can be reflected back from the load. A coupler can be included in a signal path between the RF source and the load to provide an indication of forward RF power of the RF signal traveling from the RF source to the load and/or an indication of reverse RF power reflected back from the load. In some applications, for example to monitor multiple frequency bands, a number of couplers may be provided with switching circuitry to, e.g., select which couplers provide a coupled signal or select directionality of operation, i.e., forward or reverse.

Referring to FIG. 1, a coupler 100 typically has a power input port 102, a power output port 104, a coupled port 106, and an isolation port 108. The electromagnetic coupling mechanism, which can include inductive and/or capacitive coupling, is typically provided by two parallel or overlapped transmission lines, such as microstrips, strip lines, coplanar lines, and the like. A main transmission line 110 extends between the power input port 102 and the power output port 104 and provides the majority of the signal 116 from the power input port 102 to the power output port 104. A coupled line 112 is adjacent the main transmission line 110 and extends between the coupled port 106 and the isolation port 108 and may extract a portion 114 of the power traveling between the power input port 102 and the power output port 104 for various purposes, including various measurements. When a termination impedance is presented to the isolation port 108, an indication of forward RF power traveling from the power input port 102 to the power output port 104 is provided at the coupled port 106.

In a forward coupling mode, as shown in FIG. 1, a coupled portion 114 is a fraction of a main signal 116 traveling from the power input port 102 to the power output port 104. Couplers are typically rated by their coupling factor, usually stated in decibels, which is a measure of the ratio of the power of the portion 114 to the power of the input signal 116. For example, a 20 dB coupler will provide a coupled signal, e.g., a portion 114, that is 20 dB lower than the input power, or about 1% of the input power.

SUMMARY OF INVENTION

Aspects and embodiments are directed to switching arrangements for sets of multiple electromagnetic couplers. Switching arrangements disclosed herein selectively interconnect the electromagnetic couplers in a way that minimizes the number of control lines and voltage signals required to achieve a desired variety of interconnection options. As discussed in more detail below, various components and features may be combined from transmission lines to form selectively interconnected electromagnetic couplers, which may be further combined with various components and features to form modules, devices, and systems.

According to one aspect, an electromagnetic coupler apparatus is provided and includes a plurality of couplers, each having a coupled port and an isolation port, an output port configured to provide a coupled signal from one or more of the plurality of couplers, and a plurality of selection control inputs, each of the plurality of selection control inputs configured to control one or more switches to select an individual one of the plurality of couplers to provide at least a portion of the coupled signal at the output port.

Some examples include a directional control input configured to control one or more switches to select whether the coupled signal provided at the output port represents a forward coupled signal or a reverse coupled signal. In certain examples, the total number of selection and directional control inputs does not exceed two more than the number of couplers.

In certain examples, exactly one of the plurality of selection control inputs is associated with each of the plurality of couplers.

Some examples include an isolation bus, the isolation bus switchably connectable to each isolation port and switchably connectable to either a termination impedance or the output port. Some examples include a coupled bus, the coupled bus switchably connectable to each coupled port and switchably connectable to either a termination impedance or the output port.

In some examples, a termination impedance is switchably connectable to at least one of the coupled ports and the isolation ports. The termination impedance may be adjustable.

According to another aspect, a coupler module is provided that includes a plurality of couplers, each having a coupled port and an isolation port, an output port configured to provide a coupled signal from one or more of the plurality of couplers, and a plurality of selection control inputs, each of the plurality of selection control inputs configured to control one or more switches to select an individual one of the plurality of couplers to provide at least a portion of the coupled signal at the output port.

Some examples include a directional control input configured to control one or more switches to select whether the coupled signal provided at the output port represents a forward coupled signal or a reverse coupled signal. In certain examples, the total number of selection and directional control inputs does not exceed two more than the number of couplers.

In certain examples, exactly one of the plurality of selection control inputs is associated with each of the plurality of couplers.

Some examples include an isolation bus, the isolation bus switchably connectable to each isolation port and switchably connectable to either a termination impedance or the output port. Some examples include a coupled bus, the coupled bus switchably connectable to each coupled port and switchably connectable to either a termination impedance or the output port.

In some examples, a termination impedance is switchably connectable to at least one of the coupled ports and the isolation ports. The termination impedance may be adjustable.

Some examples include an antenna switch coupled to a main transmission line associated with at least one of the plurality of couplers. Some examples include a power amplifier coupled to a main transmission line associated with at least one of the plurality of couplers.

According to another aspect, an electronic device is provided. The electronic device includes a plurality of couplers, each having an input port, an output port, a coupled port, and an isolation port, a transceiver coupled to at least one of the input ports and configured to produce a transmit signal, a coupler output configured to provide a coupled signal from one or more of the plurality of couplers, and a plurality of selection control inputs, each of the plurality of selection control inputs configured to control one or more switches to select an individual one of the plurality of couplers to provide at least a portion of the coupled signal at the coupler output.

Some examples include a directional control input configured to control one or more switches to select whether the coupled signal provided at the output port represents a forward coupled signal or a reverse coupled signal. In certain examples, the total number of selection and directional control inputs does not exceed two more than the number of couplers.

In certain examples, exactly one of the plurality of selection control inputs is associated with each of the plurality of couplers.

Some examples include an isolation bus, the isolation bus switchably connectable to each isolation port and switchably connectable to either a termination impedance or the output port. Some examples include a coupled bus, the coupled bus switchably connectable to each coupled port and switchably connectable to either a termination impedance or the output port.

In some examples, a termination impedance is switchably connectable to at least one of the coupled ports and the isolation ports. The termination impedance may be adjustable.

Some examples include an antenna switch module connected to at least one of the input ports or the output ports and configured to direct the transmit signal to an antenna. Some examples include a power amplifier connected to the transceiver and configured to amplify the transmit signal. Some examples include an antenna coupled to at least one of the output ports, the antenna being configured to transmit the transmit signal and to receive a receive signal. Some examples include one or more of a sensor module, a memory, a baseband sub-system, a user interface, and a battery.

According to yet another aspect, an electromagnetic coupler apparatus is provided that includes a plurality of couplers, each having a coupled port and an isolation port, an output port to provide a coupled signal from one or more of the plurality of couplers, a first bus selectively coupled to one or more of the coupled ports, a second bus selectively coupled to one or more of the isolation ports, a first forward switch disposed between the first bus and the output port, configured to selectively connect the first bus to the output port, a second forward switch disposed between the second bus and a termination node, configured to selectively connect the second bus to the termination node, a first reverse switch disposed between the first bus and the termination node, configured to selectively connect the first bus to the termination node, and a second reverse switch disposed between the second bus and the output port, configured to selectively connect the second bus to the output port.

A forward control input may be coupled to the first and second forward switches to control a state of the first and second forward switches. A reverse control input may be coupled to the first and second reverse switches to control a state of the first and second reverse switches.

A termination impedance may be coupled to the termination node. The termination impedance may be adjustable.

Certain examples include a plurality of selection control inputs, each of the plurality of selection control inputs configured to select an individual one of the plurality of couplers to be selectively coupled to the first bus and the second bus.

In certain examples, a plurality of control inputs is included and does not exceed two more than the number of couplers.

According to another aspect, a module includes a plurality of couplers, each having a coupled port and an isolation port, an output port to provide a coupled signal from one or more of the plurality of couplers, a first bus selectively coupled to one or more of the coupled ports, a second bus selectively coupled to one or more of the isolation ports, a first forward switch disposed between the first bus and the output port, configured to selectively connect the first bus to the output port, a second forward switch disposed between the second bus and a termination node, configured to selectively connect the second bus to the termination node, a first reverse switch disposed between the first bus and the termination node, configured to selectively connect the first bus to the termination node, and a second reverse switch disposed between the second bus and the output port, configured to selectively connect the second bus to the output port.

According to some examples, a forward control input is coupled to the first and second forward switches to control a state of the first and second forward switches. Some examples include a reverse control input coupled to the first and second reverse switches to control a state of the first and second reverse switches.

A termination impedance may be coupled to the termination node. The termination impedance may be adjustable.

Certain examples include a plurality of selection control inputs, each of the plurality of selection control inputs configured to select an individual one of the plurality of couplers to be selectively coupled to the first bus and the second bus.

In certain examples, a plurality of control inputs is included and does not exceed two more than the number of couplers.

Some examples include an antenna switch coupled to a main transmission line associated with at least one of the plurality of couplers. Some examples include a power amplifier coupled to a main transmission line associated with at least one of the plurality of couplers.

According to another aspect, an electronic device includes a plurality of couplers, each having an input port, an output port, a coupled port, and an isolation port, a transceiver coupled to at least one of the input ports and configured to produce a transmit signal, a coupler output configured to provide a coupled signal from one or more of the plurality of couplers, a first bus selectively coupled to one or more of the coupled ports, a second bus selectively coupled to one or more of the isolation ports, a first forward switch disposed between the first bus and the coupler output, configured to selectively connect the first bus to the output port, a second forward switch disposed between the second bus and a termination node, configured to selectively connect the second bus to the termination node, a first reverse switch disposed between the first bus and the termination node, configured to selectively connect the first bus to the termination node, and a second reverse switch disposed between the second bus and the coupler output, configured to selectively connect the second bus to the output port.

According to some examples, a forward control input is coupled to the first and second forward switches to control a state of the first and second forward switches. Some examples include a reverse control input coupled to the first and second reverse switches to control a state of the first and second reverse switches.

A termination impedance may be coupled to the termination node. The termination impedance may be adjustable.

Certain examples include a plurality of selection control inputs, each of the plurality of selection control inputs configured to select an individual one of the plurality of couplers to be selectively coupled to the first bus and the second bus.

In certain examples, a plurality of control inputs does not exceed two more than the number of couplers.

Some examples include an antenna switch module connected to at least one of the input ports or the output ports and configured to direct the transmit signal to an antenna. Some example include a power amplifier connected to the transceiver and configured to amplify the transmit signal. Some examples include an antenna coupled to at least one of the output ports, the antenna being configured to transmit the transmit signal and to receive a receive signal. Some examples include one or more of a sensor module, a memory, a baseband sub-system, a user interface, and a battery.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 4A is a diagram of another example of a switched multi-coupler;

DETAILED DESCRIPTION

Various wireless or communication devices use electromagnetic couplers to sense radio frequency or other signal levels at various locations along a signal path. For example, couplers are often used to provide a signal sample near an antenna to detect transmitted or received signal power or to detect reflected power due to antenna mismatches. Couplers are also used near amplifiers to detect signal power or to analyze the amplified signal to detect distortion or other amplifier artifacts. In some applications, multiple couplers may be interconnected to provide various coupled signals. For example, an arrangement of multiple couplers may beneficially provide coupled signals from two different frequency bands in use at various intervals or simultaneously. A first coupler may be designed for operation at a certain frequency band while a second coupler is designed for a different frequency band, and both couplers may be interconnected such that a coupled port simultaneously provides a coupled signal from each coupler. In other cases, two or more couplers may be switchably interconnected so that any or all of the couplers may be de-coupled from a main transmission line when not needed. For example, if a certain frequency band is not in use, or it is not necessary to measure or monitor that frequency band, the coupler for the certain frequency band may be selectively de-coupled to, e.g., reduce signal loss.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

Figure 1:
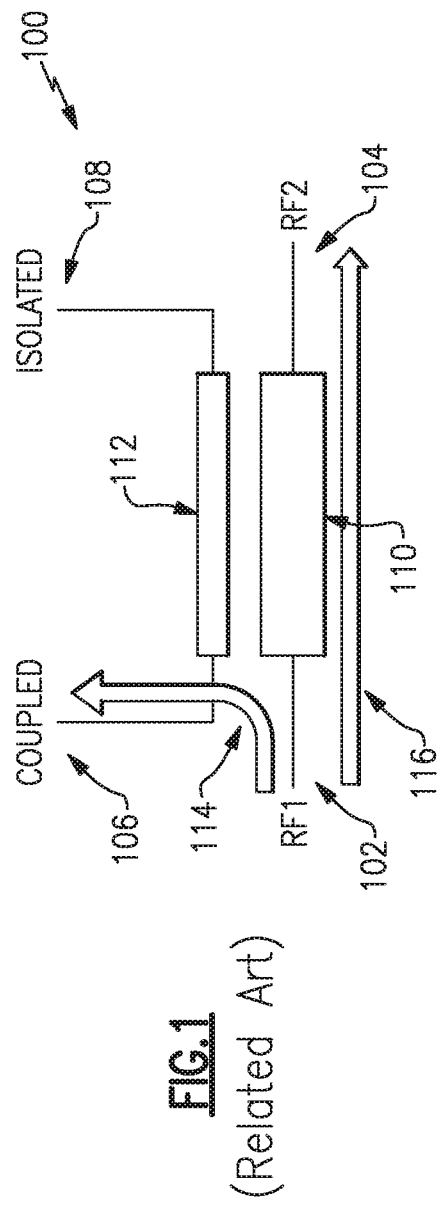
FIG. 1 is a diagram of an example of an electromagnetic coupler.
Figure 2:
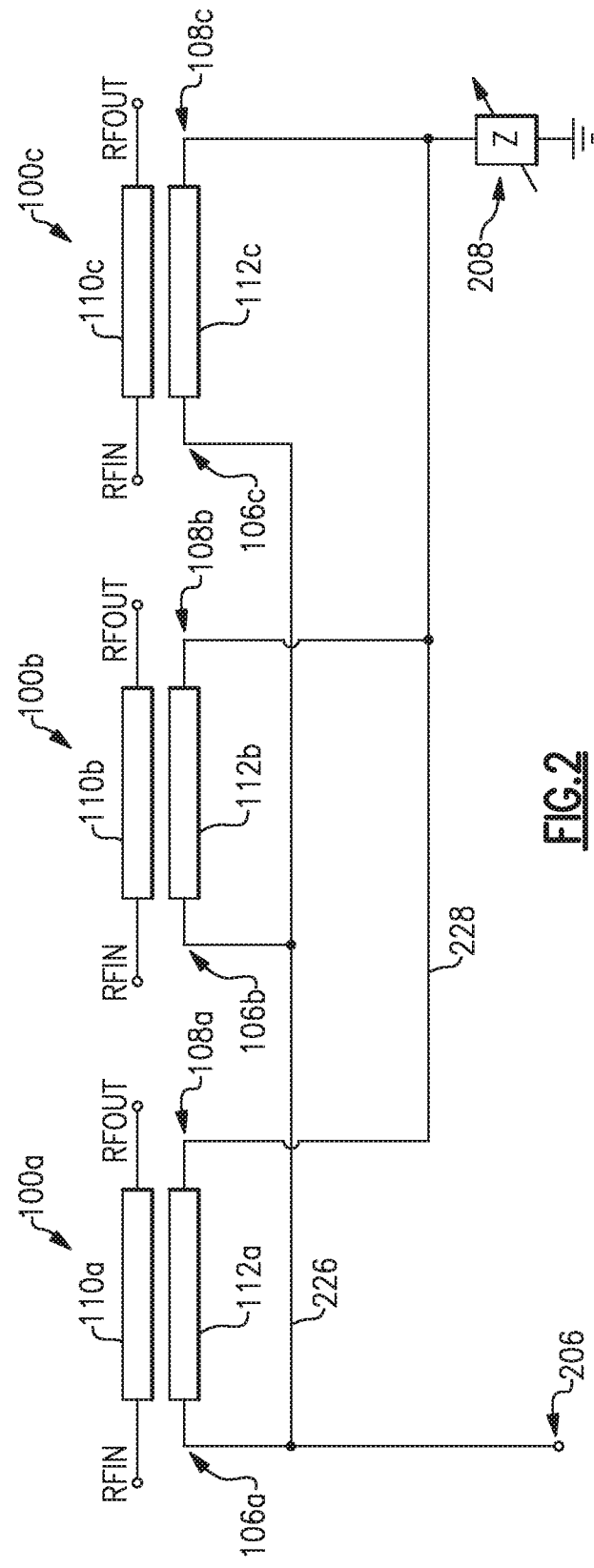
FIG. 2 is a diagram of one example of a multi-coupler apparatus.

FIG. 2 shows an example of a multi-coupler apparatus 200 that includes three interconnected couplers 100a, 100b, 100c. The couplers 100 are interconnected such that each of their coupled ports 106a, 106b, 106c is connected to a common coupled bus 226 to provide one coupled output 206. Additionally, each isolation port 108a, 108b, 108c is connected to a common isolation bus 228 that provides connection to a shared termination impedance 208, which may be adjustable. The example of the multi-coupler apparatus 200 illustrated in FIG. 2 is a simplified example of an arrangement that can provide coupled signals from multiple couplers, each of which may be designed for differing frequency bands or may be connected to different amplifier outputs or different antennas, for example. Alternate arrangements may include the coupled lines 112 connected in series rather than in parallel, as shown. As shown, each of the main transmission lines 110 is available to be connected to, and to convey, different main signals. Alternately, two or more of the main transmission lines 110 may be connected in series such that each conveys the same signal. Additionally, each coupler 100 may have its own termination impedance rather than the shared termination impedance 208. In other arrangements there may be more than three couplers interconnected in similar manners.

Each of the couplers 100 in FIG. 2 is permanently interconnected and may contribute to a coupled signal at the coupled output 206, e.g., when the respective main transmission line 110 conveys a suitable signal. Each of the couplers 100 may also affect the coupled output 206 or may interact with or influence each other even when such is not desirable. Accordingly, coupler arrangements in accord with aspects and examples disclosed herein may include switching components to selectively disconnect various elements (e.g., inputs, outputs, transmission lines, ports, termination impedances, etc.). One example of a switched multi-coupler 300 is illustrated in FIG. 3 and includes three couplers 100 with a shared coupled output 302 and a shared termination impedance 304, similar to that in FIG. 2, but further including forward switches 306, 308, and reverse switches 310, 312 that selectively connect or disconnect each coupler 100 to the coupled output 302 and the termination impedance 304.

Figure 3:
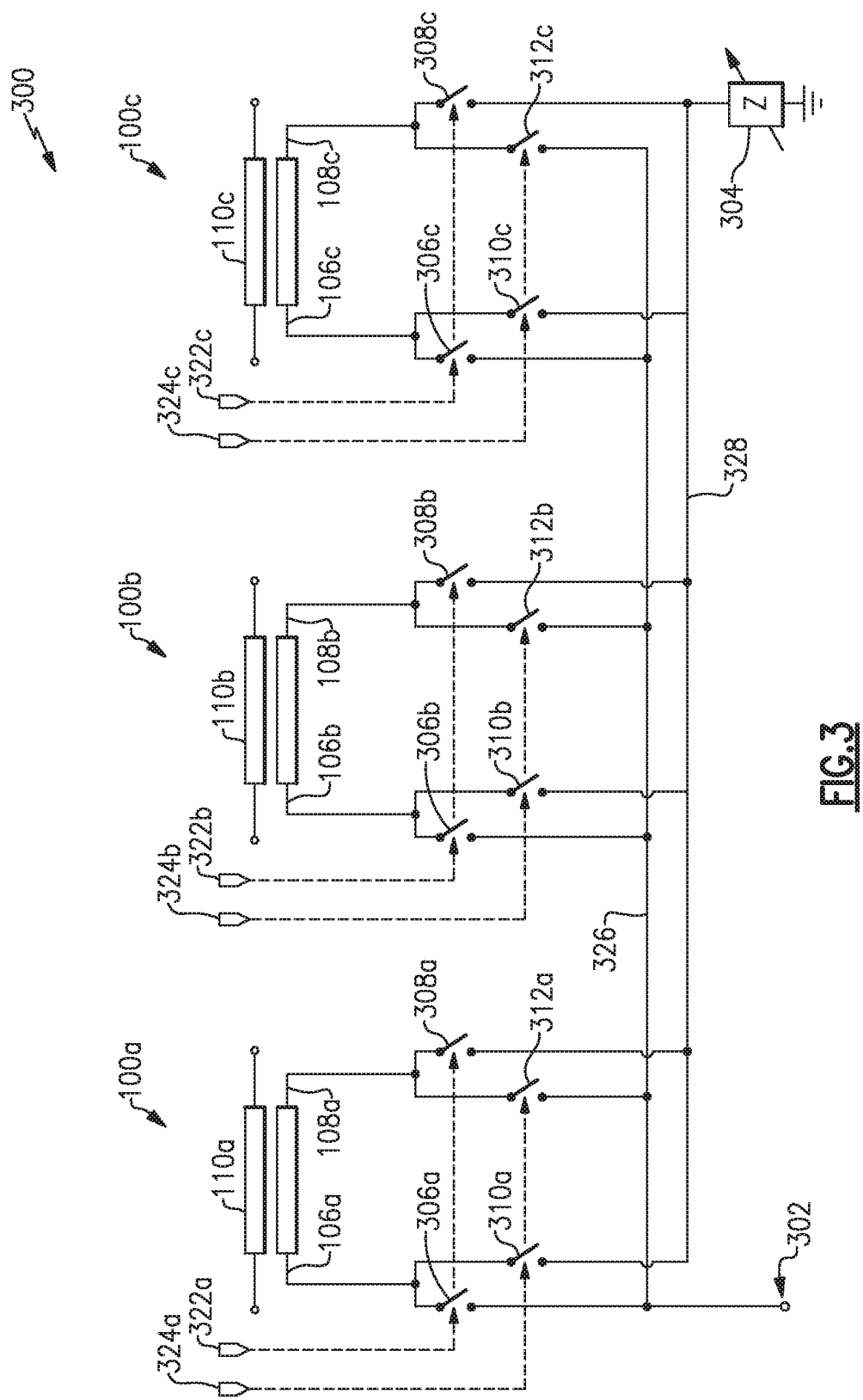
FIG. 3 is a diagram of one example of a switched multi-coupler.

With particular reference to coupler 100a of FIG. 3, a forward switch 306a selectively connects the coupled port 106a to a common output bus 326 that provides connection to the coupled output 302. Another forward switch 308a selectively connects the isolation port 108a to a common termination bus 328 that provides connection to the termination impedance 304. In similar manner, a reverse switch 310a selectively connects the coupled port 106a to the termination impedance 304, and another reverse switch 312a selectively connects the isolation port 108a to the coupled output 302.

When the forward switches 306a, 308a are both in a conducting ("on") state, and the reverse switches 310a, 312a are both in a non-conducting ("off") state, the coupler 100a provides a coupled signal to the coupled output 302 indicative of a forward signal on the main transmission line 110a. For a reverse coupled mode, the forward switches 306a, 308a are turned off and the reverse switches 310a, 312a are turned on, and the coupler 100a provides a coupled signal to the coupled output 302 indicative of a reverse signal on the main transmission line 110a. When the forward switches 306a, 308a and the reverse switches 310a, 312a are all off, the coupler 100a is decoupled and substantially does not provide any signal to the coupled output 302.

As discussed in more detail below, with reference to FIG. 5 and FIG. 6, each of the switches 306, 308, 310, 312 may be constructed using various semiconductor fabrication techniques and may be formed of one or more transistors, such as field effect transistors (FETs), bipolar junction transistors (BJTs), or others, or as a combination of transistor types. Each of the switches 306, 308, 310, 312 may be controlled by a voltage applied to a control input of the transistors, such as the gate of a FET or the base of a BJT.

With further reference to FIG. 3, the forward switches 306a, 308a may be controlled by a single control signal, as shown, because the forward switches 306a, 308a are generally desired to be in identical states at any given time. Likewise, the reverse switches 310a, 312a may be controlled by a single control signal. Accordingly, a forward control input 322a may receive a voltage signal that turns the forward switches 306a, 308a on or off based upon the voltage received. Similarly, a reverse control input 324a may receive a voltage signal that turns the reverse switches 310a, 312a on or off based upon the voltage received.

Each of the couplers 100b, 100c have similar forward and reverse switches, 306, 308, 310, 312, and similar forward and reverse control inputs 322, 324. Other examples may have different arrangements of switches and/or control inputs.

It should be noted that with the multi-coupler 300 illustrated in FIG. 3, each of the three couplers 100 may be placed in a forward coupling mode, a reverse coupling mode, or a decoupled mode. In some examples, only one of the three couplers 100 is connected at any given time, in forward or reverse coupling mode, to the coupled output 302 and the termination impedance 304. In other examples, two or more of the couplers 100 may be connected at the same time. Various examples may include additional couplers similarly provided with forward and reverse switches and having forward and reverse control inputs.

The switched multi-coupler 300 shown in FIG. 3 includes six control inputs, three each of forward control inputs 322a, 322b, 322c and three each of reverse control inputs 324a, 324b, 324c. To control the switched multi-coupler 300, a decoder may be provided that interprets or translates a control command (e.g., a value from a register) into six control voltage signals. Each control voltage signal may be provided by a voltage level shifter. Each level shifter provides a voltage to one of the control inputs. As illustrated in FIG. 3, the switched multi-coupler 300 has six control inputs 322, 324 and therefore requires six level shifters. For comparison, if each of the individual switches 306, 308, 310, 312 has a dedicated control input, twelve level shifters would be required to control the arrangement 300 because there are twelve individual switches 306, 308, 310, 312. Accordingly, by combining the control inputs for the switches that are desired to always be in the same state, e.g., both forward switches 306a and 308a for coupler 100a are "on" or "off" together, the number of control inputs (and level shifters) required is reduced. The switched multi-coupler 300 of FIG. 3 may be extended to additional couplers, to accommodate changing parameters or various operational criteria, with two control inputs (and two level shifters) for each coupler. More generally, the switched multi-coupler 300 has a number of control inputs that is two times the number of couplers, i.e., 2N.

A further reduction in control inputs may be achieved as illustrated by a further example shown in FIG. 4A. The switched multi-coupler 400a shown in FIG. 4A includes three couplers 100, a coupled output 402, and a termination impedance 404, similar to those in FIGS. 2 and 3. In some examples, the termination impedance 404 may be adjustable, as shown, to allow various tuning or optimization for certain signals, frequencies, bands, etc. The switched multi-coupler 400a further includes a single pair of forward switches 406, 408 and a single pair of reverse switches 410, 412. The forward switches 406, 408 and reverse switches 410, 412 are arranged to selectively connect the coupled output 402 to a coupled bus 426 or an isolation bus 428 and to selectively connect the termination impedance 402 to the coupled bus 426 or the isolation bus 428. Each of the three couplers 100 has a pair of selection switches 432, 434 that selectively connect the coupler 100 to the coupled bus 426 and the isolation bus 428. Specifically, the isolation switch 432a selectively connects the coupled port 106a of the coupler 100a to the coupled bus 426. The isolation switch 434a selectively connects the isolation port 108a of the coupler 100a to the isolation bus 428. Each of the couplers 100a, 100b, 100c has similar isolation switches 432, 434. Certain examples include additional couplers with similar isolation switches.

Each of the three couplers 100 shown in FIG. 4A has an isolation control input 430 to control the respective isolation switches 432, 434 to be on or off, thereby connecting the respective coupler 100 to the coupled bus 426 and the isolation bus 428 in the on state, or decoupling the coupler 100 in the off state. The switched multi-coupler 400a of FIG. 4A may be extended to additional couplers, to accommodate changing parameters or various operational criteria, using only a single additional control input (and a single level shifter) for each additional coupler. Generally, the switched multi-coupler 400a has a single control input per coupler and two control inputs for the selection of directionality via the forward and reverse switches, i.e., N+2.

Figure 4B:
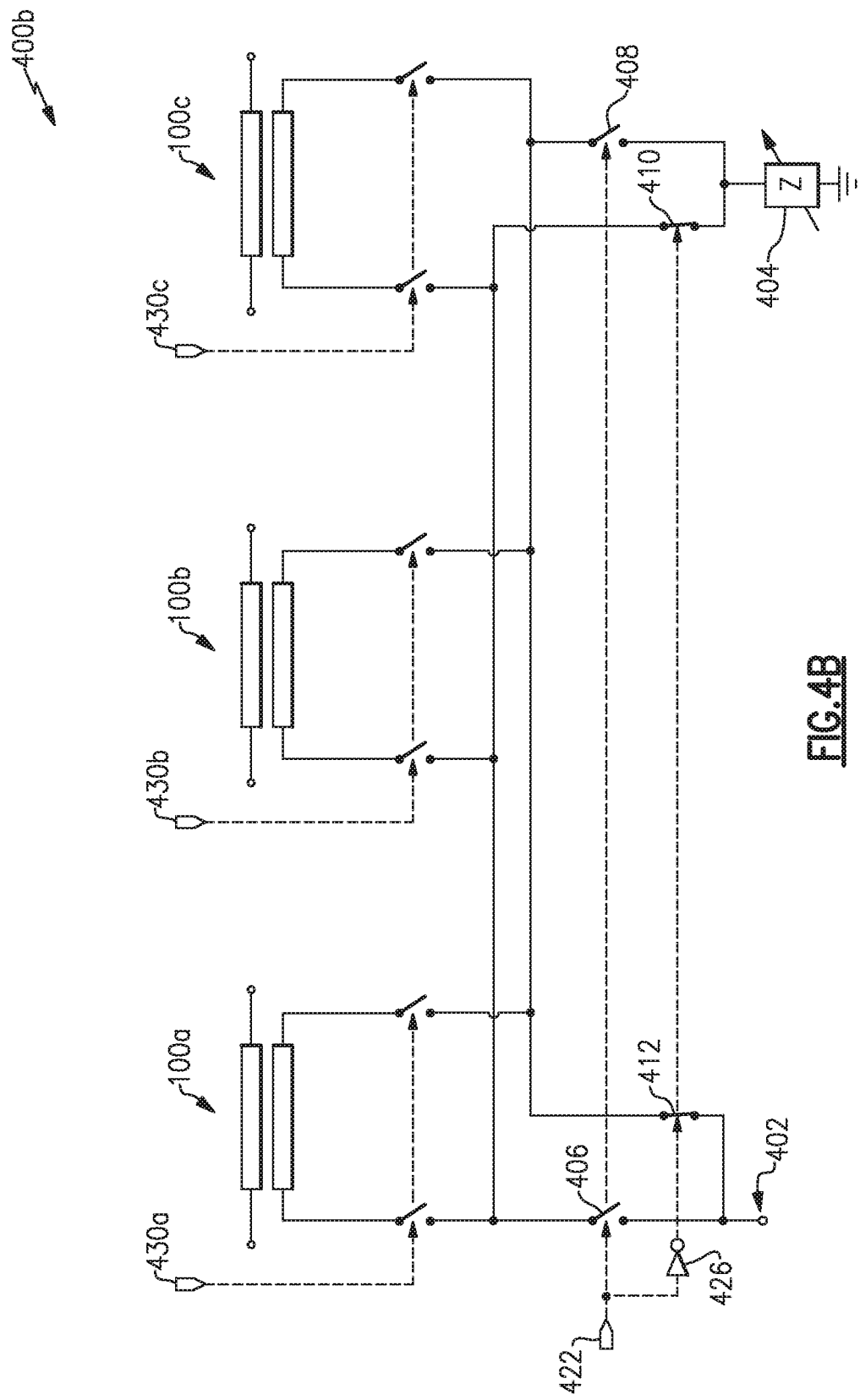
FIG. 4B is a diagram of another example of a switched multi-coupler.

Yet further reduction in number of control inputs is illustrated in FIG. 4B that shows another example of a switched multi-coupler 400b identical to the switched multi-coupler 400a except that the reverse switches 410, 412 are driven by the same control line 422 as the forward switches 406, 408. Such is accomplished by routing the voltage received on the control line 422 through a voltage inverter 426 that holds the reverse switches 410, 412 to be in the opposite state (on or off) from that of the forward switches 406, 408. Only a single directionality, forward or reverse, is selected at one time, and is common to all the couplers 100 of the arrangement 400b. Accordingly, it is not necessary to have a control input for forward directionality and an additional control input for reverse directionality. Therefore, the control input 424 of the switched multi-coupler 400a is removed and replaced with the voltage inverter 426 coupled to the control input 422 in the switched multi-coupler 400b. The switched multi-coupler 400b of FIG. 4B may be extended to additional couplers, to accommodate changing parameters or various operational criteria, with a number of control inputs that is one more than the number of couplers, i.e., N+1.

The various switches discussed with respect the arrangements 300, 400a, 400b above may be constructed in a variety of manners depending upon the particular implementation. FIGS. 5 and 6 illustrate two examples of transistor-based switches. In FIG. 5, the switch 500 includes two switch terminals 502 and is constructed of one or more transistors 510 in series between the terminals 502. The conducting state of the transistors 510, on or off, is controlled by a voltage received at a control input 512, such voltage being applied to each transistor 510 via a resistor 514, e.g., at a gate or base of each transistor 510. In certain examples the voltage may be directly applied to the transistor 510 without a resistor 514. Each transistor 510 may include a biasing resistor 516, for example coupling a drain and source of a field effect transistor, as shown. Some examples may include only a single transistor 510 to selectively provide an on or off state between the terminals 502.

Figure 5:
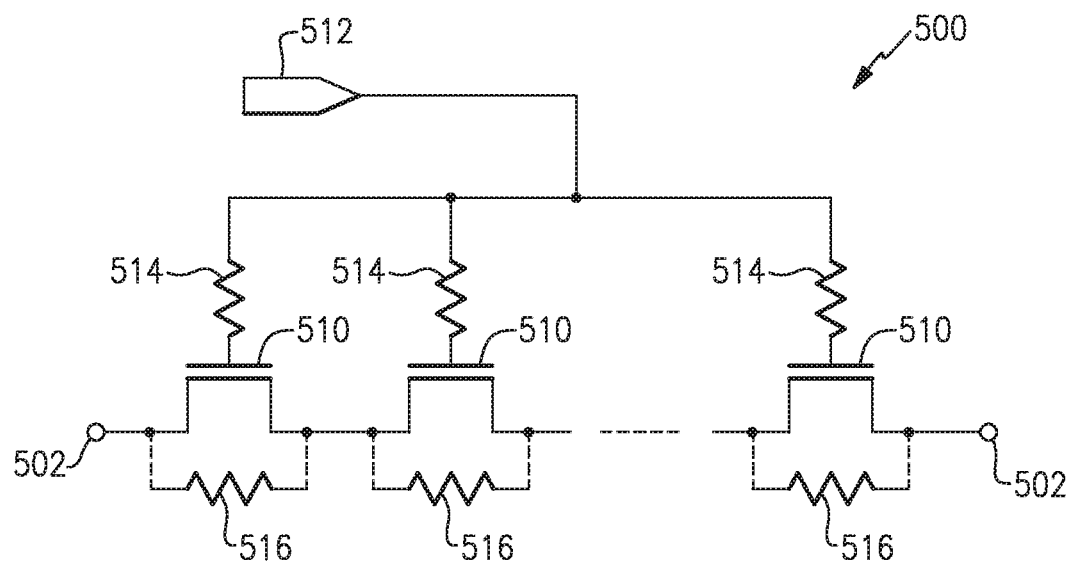
FIG. 5 is a diagram of one example of a switch formed from transistors.

In other examples, a plurality of series-connected transistors 510, as shown in FIG. 5, may provide additional isolation than may be provided over fewer transistors or by only one transistor 510. Additionally, a higher number of transistors 510 in series may accommodate a higher input power (of a signal received at one of the terminals 502) as the signal level is distributed across more transistors 510, reducing the possibility of voltage breakdown in any one or more of the transistors 510. It should be noted that a single transistor 510 may be sufficient in many cases, such as for couplers with low coupling factor, or when low signal levels may be present, or otherwise for designs in which high isolation capability of the switch 500 may not be critical.

Figure 6:
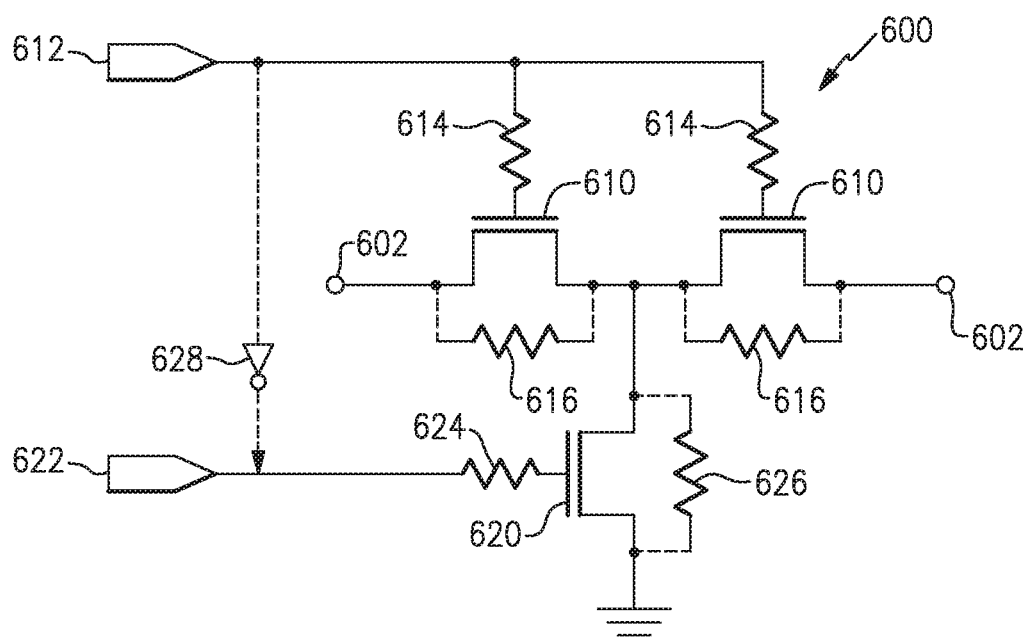
FIG. 6 is a diagram of another example of a switch formed from transistors.

The switch 600 in FIG. 6 includes at least two transistors 610 in series and also includes at least one shunt transistor 620 between at least two of the series-connected transistors 610. Each of the transistors 610, 620 may include a biasing resistor 616, 626. When the switch 600 is off, i.e., not providing conductivity between the terminals 602, the shunt transistor 620 is controlled to be on while the series transistors 610 are controlled to be off. The switch 600 is controlled similarly to switch 500, by a voltage received at the control input 612, such voltage being impressed upon a gate or base of each series-connected transistor 610, either directly or via a resistor 614. A shunt control input 622 similarly applies a voltage to the shunt transistor 620, directly or through a resistor 624, to control the shunt transistor 620 to be in an opposite state, on or off, from the series-connected transistors 610. For example, the control input 612 and the shunt control input 622 may be controlled by one or more decoders to apply control voltages such that the shunt transistor 620 is in an off state when the series transistors 610 are in an on state, and vice versa. Alternatively, a voltage inverter 628 may apply a control voltage to the shunt transistor 620 to control the shunt transistor 620 to be in an opposite conducting state as compared to the series transistors 610. The shunt transistor 620 in the on state increases isolation performance of the switch 600 by grounding the otherwise free floating electrical connection between the series-connected transistors 610. In some examples, a plurality of shunt transistors 620 may be included, e.g., in series, in a shunt arm of a switch. It is appreciated that any of the switches with respect to any of the examples of coupler arrangements discussed above may be formed from variations and/or combinations of the switch 500 and the switch 600, with more or fewer series transistors and more or fewer shunt transistors, as well as other configurations. Further, each transistor may be any suitable type of transistor including, for example, a field-effect transistor (FET) or a bipolar junction transistor (BJT).

Figure 7:
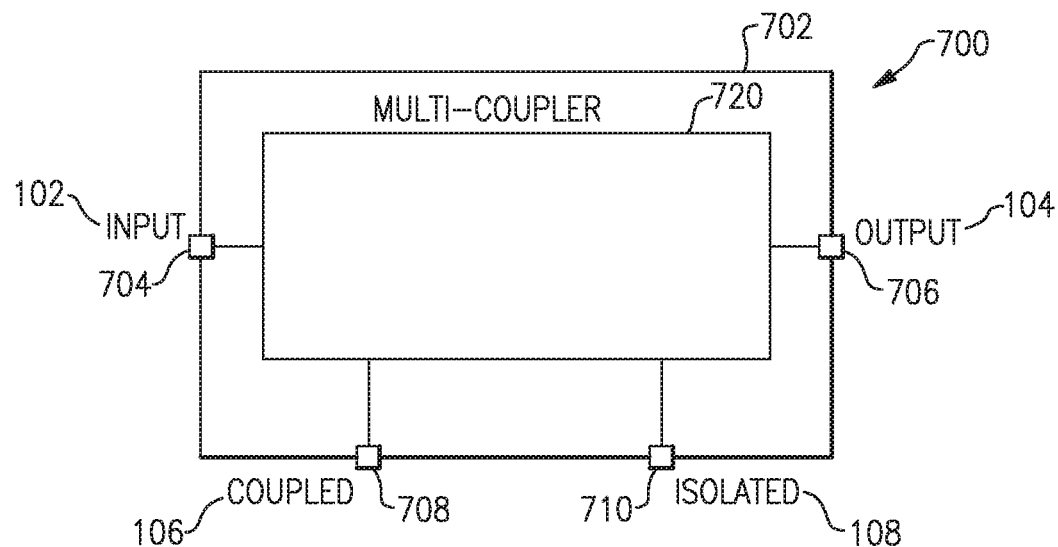
FIG. 7 is a block diagram of one example of a module including a switched multi-coupler.

Embodiments of coupler arrangements with selective switching as described herein can be implemented in a variety of different modules including, for example, a standalone coupler module, a front-end module, a module combining the couplers with an antenna switching network, an impedance matching module, an antenna tuning module, or the like. FIG. 7 illustrates one example of a coupler module that can include any of the embodiments or examples of the multi-couplers with switching arrangements discussed herein.

FIG. 7 is a block diagram of one example of a module 700 including a switched multi-coupler 720, which may correspond, for example, to any example of selectively switchable coupler arrangements disclosed herein. The module 700 includes a substrate 702 and may include various dies and may include packaging, such as, for example, an overmold to provide protection and facilitate easier handling. An overmold may be formed over substrate 702 and dimensioned to substantially encapsulate the various dies and components thereon. The module 700 may further include connectivity from the switched multi-coupler 720 to the exterior of the packaging to provide signal interconnections, such as input port connection 704, output port connection 706, coupled port connection 708, and control input connection 710. Certain examples may have multiple input, output, and coupled connections to accommodate access to individual couplers of the multi-coupler. Some examples may include one or more isolation ports for termination impedances, and/or may include various forms of control connection interface types. The connections 704, 706, 708, and 710 may be provided in part by wirebonds or solder bumps, for example, and may include multiple electrical connections where appropriate.

Embodiments of the switched multi-couplers disclosed herein, optionally packaged into a module 700, may be advantageously used in a variety of electronic devices. Examples of the electronic devices can include, but are not limited to, consumer electronic products or components thereof, electronic test equipment, communications infrastructure (such as a base station, router, transmitter, etc.) and more. Specific examples of such electronic devices can include, but are not limited to, a mobile phone such as a smart phone, a tablet, a telephone, a television, a computer or computer peripheral, a modem, such as a cable modem or otherwise, a wireless router or access point, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 8:
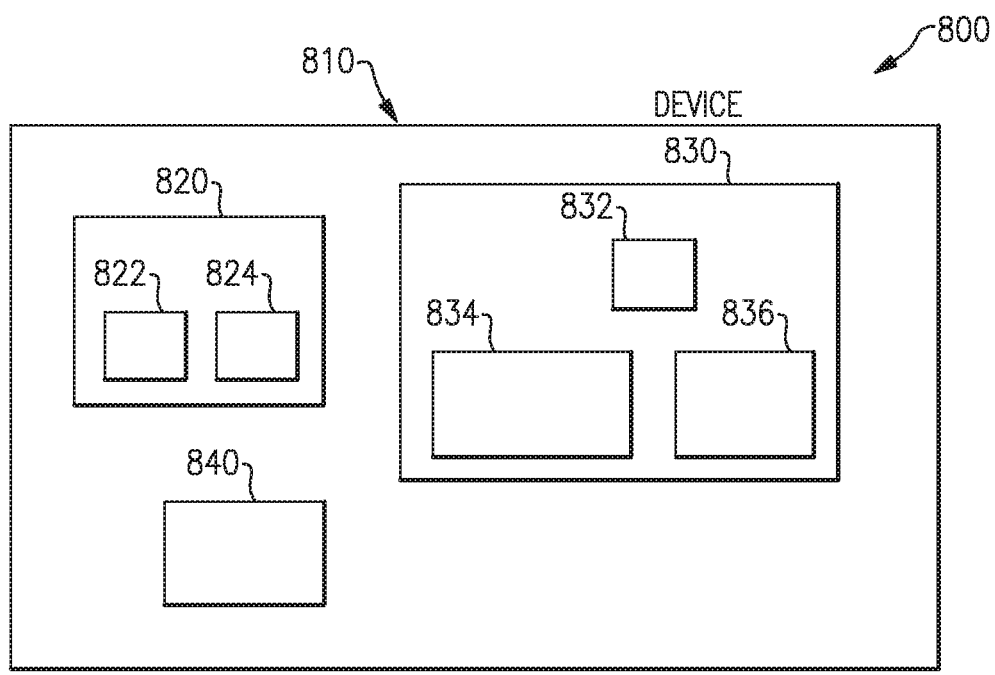
FIG. 8 is a block diagram of one example of an electronic device that may include a switched multi-coupler.

FIG. 8 is a schematic block diagram of a generic example of an electronic device 800. The electronic device 800 includes a circuit board 810 having numerous modules 820, 830, 840 mounted thereon. The circuit board 810 may have multiple layers and may include circuit elements and interconnections in the layers and/or mounted on the surface of the circuit board 810. Each of the modules 820, 830, 840 may have a multi-layer substrate within and upon which there may also be various circuit elements and interconnections. Additionally, the modules 820, 830, 840 may further include dies, e.g., dies 822, 824, 832, 834, 836, each of which may have multiple layers and include various circuit elements and interconnections. A coupler arrangement in accord with aspects and embodiments disclosed herein may be implemented within, among, or across any of the layers of the various structures, e.g., circuit board, substrates, and dies, as part of an electronic device 800, such as a cell phone, tablet, smart device, router, cable modem, wireless access point, etc.

Figure 9A:
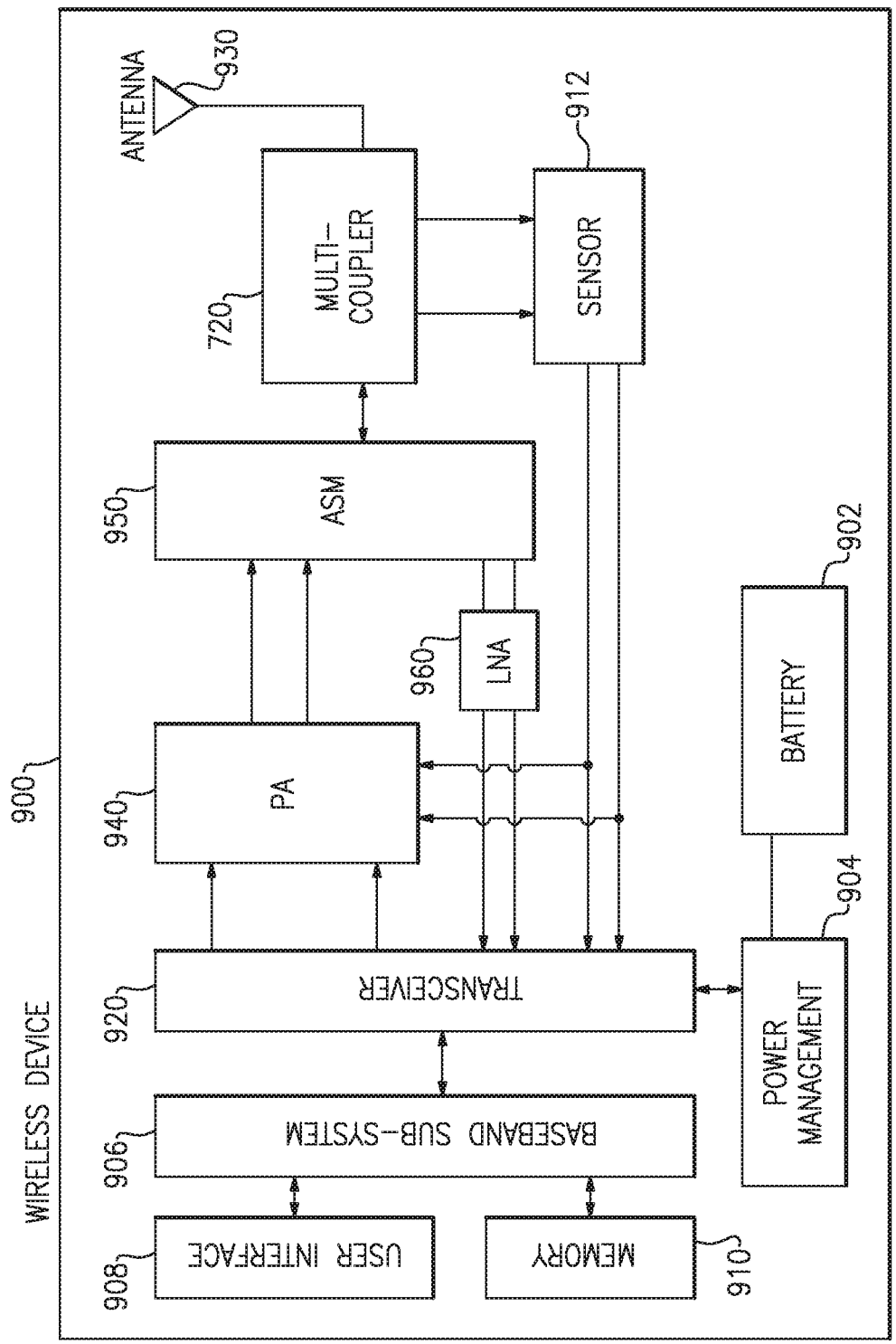
FIGS. 9A-9C are block diagrams of various examples of electronic devices that include a switched multi-coupler.
Figure 9B:
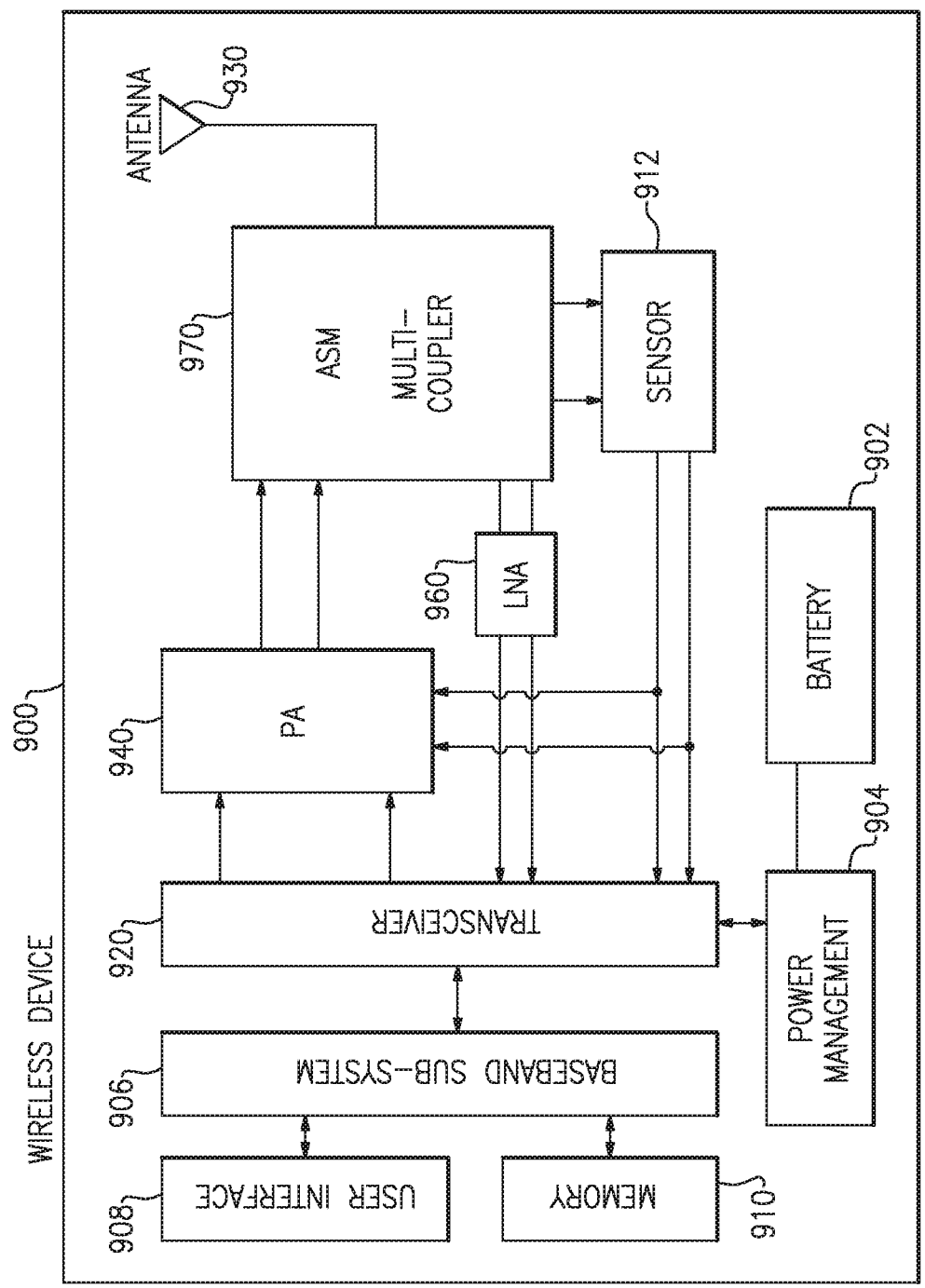
Figure 9C:
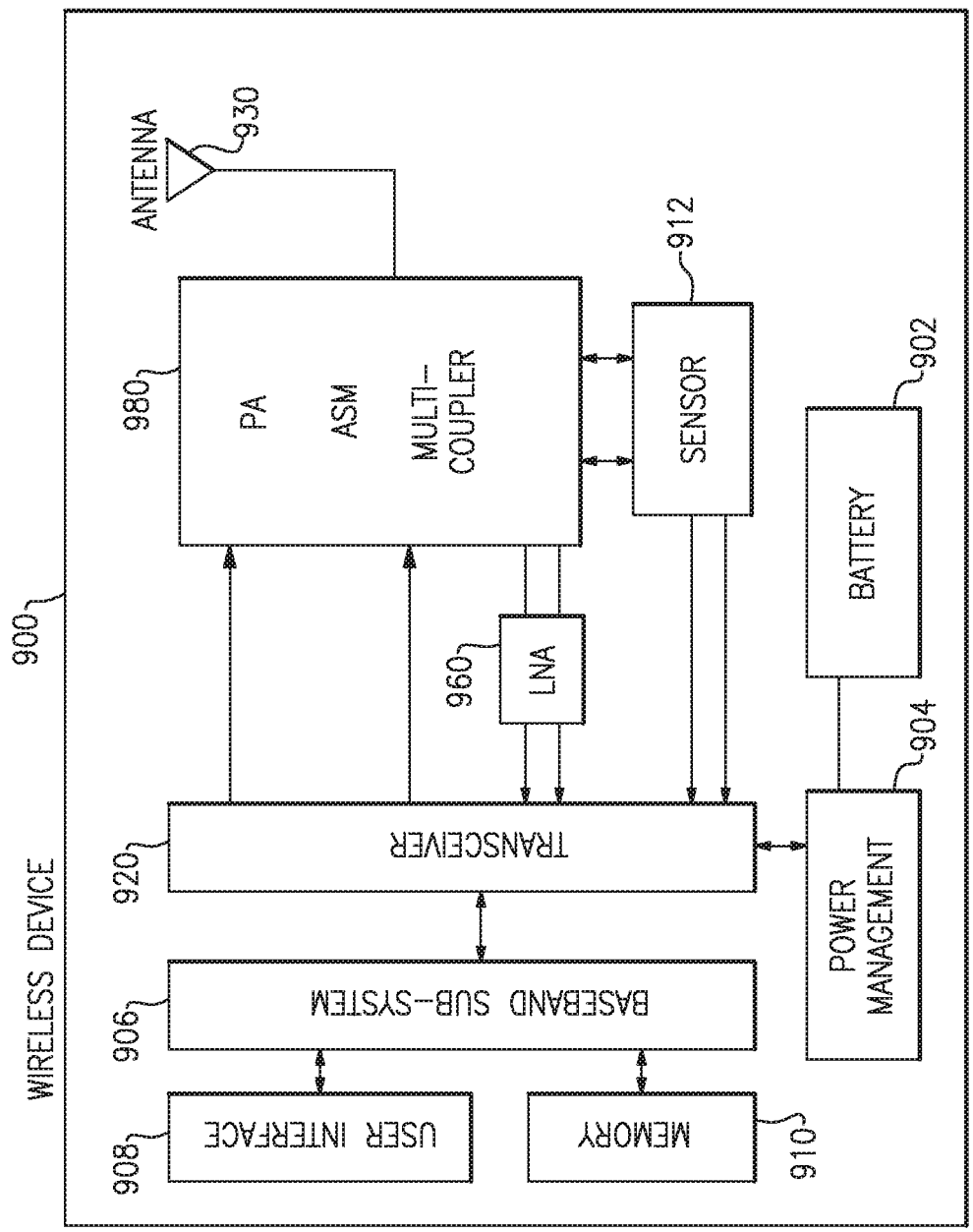

FIGS. 9A-9C illustrate examples of an electronic device 900 including a switched multi-coupler, e.g., switched multi-coupler 720, according to various embodiments discussed above. The switched multi-coupler 720 is configured to extract a portion of power of one or more signals traveling between a transceiver 920 and an antenna 930. For example, the switched multi-coupler 720 may include a coupler for each frequency band in which the transceiver 920 operates. The multi-coupler 720 may receive control input from the transceiver 920, or from a baseband sub-system 906, for example, to control the multi-coupler 720 to selectively enable one or more of the couplers associated with the multi-coupler 720.

In general, the switched multi-coupler 720 is bi-directional, and control inputs may selectively determine whether the multi-coupler 720 operates in a forward or reverse mode. As illustrated, in the forward or transmit direction, a power amplifier 940 receives a signal, such as a radio frequency (RF) signal, from the transceiver 920 and provides an amplified signal to the antenna 930 via an antenna switch module 950 and the switched multi-coupler 720. Similarly, in the receive direction, a received signal is provided from the antenna 930 to the transceiver 920 via the switched multi-coupler 720, the antenna switch module 950, and a low noise amplifier 960. The various examples of an electronic device 900 shown in FIGS. 9A-9C include an antenna 930 and are generally examples of wireless devices. In other examples, an electronic device may additionally or alternately include wired connections, such as a cable modem or wired router, which may include a physical connector for coupling to cables and the like. Various additional elements may be included in electronic devices and/or some elements may be omitted.

The power amplifier 940 amplifies an RF signal. The power amplifier 940 can be any suitable power amplifier. For example, the power amplifier 940 can include one or more of a single stage power amplifier, a multi-stage power amplifier, a power amplifier implemented by one or more bipolar transistors, or a power amplifier implemented by one or more field effect transistors. The power amplifier 940 can be implemented on a GaAs die, CMOS die, or a SiGe die, for example.

The antenna 930 can transmit the amplified signal, and receive signals. For example, in a cellular phone, wireless base station, or the like, the antenna 930 can transmit and receive RF signals to and from other devices. In alternate embodiments multiple antennas may be used.

Operating in the forward mode, the switched multi-coupler 720 can extract a portion of the power of the amplified signal traveling between the power amplifier 940 and the antenna 930. The switched multi-coupler 720 can generate an indication of forward power traveling from the power amplifier 940 to the antenna 930, for example. Operating in the reverse mode, the switched multi-coupler 720 can generate an indication of reflected power traveling from the antenna 930 toward the power amplifier 940, or can extract a portion of the power of a signal received by the antenna 930 from an external source. In either mode, the switched multi-coupler 720 may provide the signal portion to a sensor 912 that provides power feedback by measuring the power of the signal portion.

The examples of device 900 of FIGS. 9A-9C further include a power management system 904 that is connected to the transceiver 920 that manages the power for the operation of the wireless device. The power management system 904 can also control the operation of a baseband sub-system 906 and other components of the device 900. The power management system 904 may manage power within the device 900 by, for example, providing power to the device 900 from a battery 902 or providing power to the device 900 from a power connector, and controlling a charge level of the battery 902 by controlling charge and discharge cycles and/or status of the battery 902.

In one embodiment, the baseband sub-system 906 is connected to a user interface 908 to facilitate various input and output of voice and/or data provided to and received from the user. The baseband sub-system 906 can also be connected to memory 910 that is configured to store data and/or instructions to facilitate operation of the device 900, and/or to provide storage of information for the user.

The power amplifier 940 can be used to amplify a wide variety of RF or other frequency-band transmission signals. For example, the power amplifier 940 can receive an enable signal that can be used to pulse the output of the power amplifier to aid in transmitting a wireless local area network (WLAN) signal or any other suitable pulsed signal. The power amplifier 940 can be configured to amplify any of a variety of types of signal, including, for example, a Global System for Mobile (GSM) signal, a code division multiple access (CDMA) signal, a W-CDMA signal, a Long Term Evolution (LTE) signal, an EDGE signal, and the like. In certain embodiments, the power amplifier 940 and associated components including switches and the like can be fabricated on GaAs substrates using, for example, pHEMT or BiFET transistors, or on a Silicon substrate using CMOS transistors, as well as other semiconductor fabrication technologies.

Still referring to FIGS. 9A-9C, the device 900 can also include a switched multi-coupler having one or more directional couplers for measuring transmitted power signals from the power amplifier 940 and for providing one or more coupled signals to a sensor module 912. The sensor module 912 can in turn send information to the transceiver 920 and/or directly to the power amplifier 940 as feedback for making adjustments to regulate the power level of the power amplifier 940. In this way the switched multi-coupler can be used to boost/decrease the power of a transmission signal having a relatively low/high power. It will be appreciated, however, that the switched multi-coupler can be used in a variety of other implementations.

In certain embodiments of any of the examples of the device 900, transmissions from the device 900 may have prescribed power limits and/or time slots. The power amplifier 940 may shift power envelopes up and down within prescribed limits of power versus time. For instance, a particular mobile phone can be assigned a transmission time slot for a particular frequency channel. In this case the power amplifier 940 may be required to regulate the power level of one or more RF power signals over time, so as to prevent signal interference from transmission during an assigned receive time slot and to reduce power consumption. In such systems, the switched multi-coupler can be used to measure the power of a power amplifier output signal to aid in controlling the power amplifier 940, as discussed above. The implementations shown in FIGS. 9A-9C are intended to be exemplary in nature only and non-limiting.

The example shown in FIG. 9B includes a combination module 970 that includes a switched multi-coupler in accord with aspects and embodiments described herein combined with an antenna switch module (e.g., ASM 950). The example shown in FIG. 9C includes a combination module 980 that incorporates a switched multi-coupler, an antenna switch module, and a power amplifier (e.g., PA 940) together as a front end module (module 980). Additional embodiments include a front end module that further incorporates one or more low noise amplifiers (e.g., LNA 960) and/or sensors (e.g., sensor 912).

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. An electromagnetic coupler apparatus comprising:
   a plurality of couplers, each of the plurality of couplers having a coupled port, an isolation port, a main transmission line, and a coupled line;
   an output port configured to provide a coupled signal from one or more of the plurality of couplers; and
   a plurality of control inputs configured to select one or more of the plurality of couplers and provide one of a forward coupled signal or a reverse coupled signal as the coupled signal to the output port, a total number of control inputs in the plurality of control inputs not exceeding two times a total number of couplers in the plurality of couplers.

2. The electromagnetic coupler apparatus of claim 1 wherein the plurality of control inputs includes a directional control input configured to control one or more switches to select whether the coupled signal provided to the output port represents the forward coupled signal or the reverse coupled signal.

3. The electromagnetic coupler apparatus of claim 2 wherein the total number of control inputs in the plurality of control inputs does not exceed two more than the total number of couplers in the plurality of couplers.

4. The electromagnetic coupler apparatus of claim 1 wherein exactly one of the plurality of control inputs is associated with one of the plurality of couplers.

5. The electromagnetic coupler apparatus of claim 1 further comprising an isolation bus, the isolation bus switchably connectable to each isolation port and switchably connectable to either a termination impedance or the output port.

6. The electromagnetic coupler apparatus of claim 1 further comprising a coupled bus, the coupled bus switchably connectable to each coupled port and switchably connectable to either a termination impedance or the output port.

7. The electromagnetic coupler apparatus of claim 1 further comprising a termination impedance switchably connectable to the coupled port of at least one of the plurality of couplers or switchably connectable to the isolation port of at least one of the plurality of couplers.

8. The electromagnetic coupler apparatus of claim 1 wherein the total number of control inputs in the plurality of control inputs is one more than the total number of couplers in the plurality of couplers.

9. A module comprising:
   a plurality of couplers, each of the plurality of couplers having a coupled port, an isolation port, a main transmission line, and a coupled line;
   an output port configured to provide a coupled signal from one or more of the plurality of couplers; and
   a plurality of control inputs configured to select one or more of the plurality of couplers and provide one of a forward coupled signal or a reverse coupled signal as the coupled signal to the output port, a total number of control inputs in the plurality of control inputs not exceeding two times a total number of couplers in the plurality of couplers.

10. The module of claim 9 wherein the plurality of control inputs includes a directional control input configured to control one or more switches to select whether the coupled signal provided to the output port represents the forward coupled signal or the reverse coupled signal.

11. The module of claim 10 wherein the total number of control inputs in the plurality of control inputs does not exceed two more than the total number of couplers in the plurality of couplers.

12. The module of claim 9 wherein exactly one of the plurality of control inputs is associated with one of the plurality of couplers.

13. The module of claim 9 further comprising an isolation bus, the isolation bus switchably connectable to each isolation port and switchably connectable to either a termination impedance or the output port.

14. The module of claim 9 further comprising a coupled bus, the coupled bus switchably connectable to each coupled port and switchably connectable to either a termination impedance or the output port.

15. The module of claim 9 further comprising a termination impedance switchably connectable to the coupled port of at least one of the plurality of couplers or switchably connectable to the isolation port of at least one of the plurality of couplers.

16. The module of claim 9 further comprising an antenna switch coupled to the main transmission line of at least one of the plurality of couplers.

17. The module of claim 9 further comprising a power amplifier coupled to the main transmission line of at least one of the plurality of couplers.

18. An electromagnetic coupler apparatus comprising:
a plurality of couplers, each having a coupled port and an isolation port;
an output port to provide a coupled signal from one or more of the plurality of couplers;
a first bus selectively coupled to one or more of the coupled ports;
a second bus selectively coupled to one or more of the isolation ports;
a first forward switch disposed between the first bus and the output port, configured to selectively connect the first bus to the output port;
a second forward switch disposed between the second bus and a termination node, configured to selectively connect the second bus to the termination node;
a first reverse switch disposed between the first bus and the termination node, configured to selectively connect the first bus to the termination node; and
a second reverse switch disposed between the second bus and the output port, configured to selectively connect the second bus to the output port.

19. The coupler apparatus of claim 18 further comprising a forward control input coupled to the first and second forward switches to control a state of the first and second forward switches.

20. The coupler apparatus of claim 18 further comprising a reverse control input coupled to the first and second reverse switches to control a state of the first and second reverse switches.

21. The coupler apparatus of claim 18 further comprising a termination impedance coupled to the termination node.

22. The coupler apparatus of claim 18 further comprising a plurality of selection control inputs, each of the plurality of selection control inputs configured to select an individual one of the plurality of couplers to be selectively coupled to the first bus and the second bus.

23. The coupler apparatus of claim 18 further comprising a plurality of control inputs not exceeding two more than the number of couplers.

* * * * *